United States Patent [19]
Fees

[11] Patent Number: 6,094,155
[45] Date of Patent: Jul. 25, 2000

[54] DUAL REFERENCE VOLTAGE BUFFER AND METHOD FOR UPDATING CDAC BIT CAPACITORS

[75] Inventor: Andreas O. Fees, Neckartenzlingen, Germany

[73] Assignee: Burr-Brown Corporation, Tucson, Ariz.

[21] Appl. No.: 08/920,841

[22] Filed: Aug. 29, 1997

[51] Int. Cl.[7] .............................. H03M 1/12; H03M 1/66; H03K 17/28; H03B 1/04

[52] U.S. Cl. ......................... 341/172; 341/150; 327/401; 327/592

[58] Field of Search ............................ 307/125; 327/75, 327/545, 400, 401, 403, 404, 592; 341/108, 144, 145, 150, 156, 166, 172

[56] References Cited

U.S. PATENT DOCUMENTS

| | | | |
|---|---|---|---|
| 4,200,863 | 4/1980 | Hodges et al. | 341/156 |
| 4,369,433 | 1/1983 | Yamakido | 341/150 |
| 4,385,286 | 5/1983 | Haque | 341/108 |
| 4,908,620 | 3/1990 | Fujisawa | 341/108 |
| 4,940,981 | 7/1990 | Naylor et al. | 341/161 |
| 5,103,230 | 4/1992 | Kalthoff et al. | 341/166 |
| 5,208,597 | 5/1993 | Early et al. | 341/172 |
| 5,281,866 | 1/1994 | Rundel | 327/544 |
| 5,302,869 | 4/1994 | Hosotani et al. | 327/75 |
| 5,469,164 | 11/1995 | Kemp | 341/145 |
| 5,530,398 | 6/1996 | Shamlou et al. | 327/545 |
| 5,581,252 | 12/1996 | Thomas | 341/144 |
| 5,600,186 | 2/1997 | Song et al. | 307/125 |
| 5,638,072 | 6/1997 | Van Auken et al. | 341/141 |
| 5,852,415 | 12/1998 | Cotter et al. | 341/120 |
| 5,914,681 | 6/1999 | Rundel | 341/135 |

*Primary Examiner*—Brian Young
*Assistant Examiner*—Patrick Wamsley
*Attorney, Agent, or Firm*—Cahill, Sutton & Thomas P.L.C.

[57] ABSTRACT

A circuit for producing a stable CDAC reference voltage in a successive approximation analog-to-digital converter includes a circuit (27) producing an input reference voltage (VREFIN), and a buffer circuit (12) producing a stable reference voltage in response to the input reference voltage. The buffer circuit includes an amplifier (13) having a non-inverting input receiving the input reference voltage. A first buffer (13B) receives the output of the amplifier and produces output that is fed back to an inverting input of the amplifier. A second buffer (18) also receives the amplifier output. A first transistor switch (19) couples the output of the second buffer to a CDAC. A second transistor switch (29) couples the CDAC to ground. A third transistor switch (26) couples the first buffer to the CDAC. The first transistor switch (19) closes to cause an initial "coarse" charging of a first capacitance of the CDAC by the second buffer (18). The third transistor switch (26) closes after the coarse charging to perform a final precise "fine" charging of the first capacitance of the CDAC by the first buffer circuit (13B). Coarse and fine discharging of the CDAC to ground also are provided to increase accuracy of the analog-to-digital converter and to minimize RFI produced thereby.

21 Claims, 5 Drawing Sheets

DUAL REFERENCE VOLTAGE BUFFER AND METHOD FOR UPDATING CDAC BIT CAPACITORS

BACKGROUND OF THE INVENTION

The invention relates to a circuit and method for increasing the speed of performing an analog-to-digital conversion and more specifically to a circuit technique for avoiding the need to wait an excessively long time to allow settling of transients produced in a reference circuit due to large switching currents produced during a successive approximation procedure. The invention also relates to reducing RFI (radio frequency interference) problems caused by large, fast switching currents in a CDAC array during a successive approximation procedure.

In analog-to-digital converters which include CDACs (capacitive digital-to-analog converters), an analog input voltage is "sampled" onto a sampling capacitor. The sampled charge then is redistributed along with charge stored in binarily weighted bit capacitors which have previously been "updated" in accordance with digital feedback one bit at a time from the output of a comparator which "tests" the voltage of a charge summing conductor on which the charge redistribution occurs in accordance with a well known successive approximation procedure. The feedback bits are stored, one at a time starting with the MSB, in a SAR (successive approximation register). The charges of the binarily weighted bit capacitors and the input sampling capacitor are redistributed one bit at a time by successively connecting one terminal of each bit capacitor either to a precision reference voltage or to ground, according to whether a corresponding digital feedback bit is a "1" or a "0".

Figure 1:
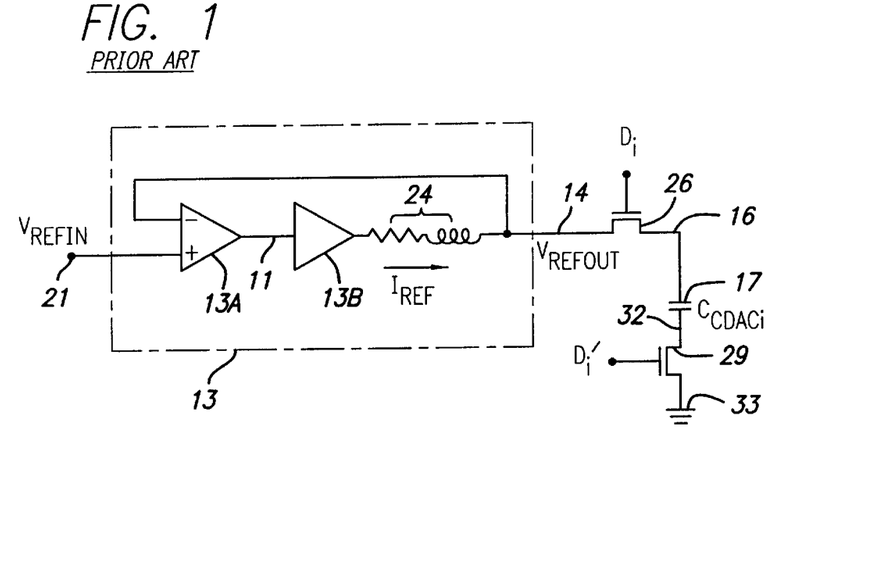
FIG. 1 is a schematic circuit diagram of a prior art reference voltage buffer used in a successive approximation analog-to-digital converter to "update" bit capacitor in a CDAC array.

FIG. 1 shows a prior art reference voltage buffer circuit 13 connected to supply a precise reference voltage $V_{REFOUT}$ to the CDAC array 17. Reference voltage buffer circuit 13 includes an operational amplifier 13A and a unity gain buffer or amplifier circuit 13B. A precision input reference voltage $V_{REFIN}$ is applied by conductor 21 to the non-inverting input of operational amplifier 13A, the output 11 of which is applied to an input of unity gain buffer 13B. The output of unity gain buffer 13B provides the output reference voltage $V_{REFOUT}$ on conductor 14. Conductor 14 also is connected to the inverting input of operational amplifier 13A. Impedance 24 includes the internal resistance of unity gain buffer 13B, through which the current $I_{REF}$ flows. Conductor 14 is coupled by a metal-oxide-semiconductor field effect transistor (MOSFET) 26 to conductor 15, which is connected to CDAC capacitor array 17.

For simplification, the circuit in FIG. 1 shows the entire CDAC array as a single capacitor 17 having any of $2^N$ values of a "code-dependant" capacitance $C_{CDACi}$, where i is 1,2 . . . N, and N is the number of bits of the CDAC. During one successive approximation conversion of an analog input to an N-bit digital output, the "lumped" capacitor 17 will have N of the $2^N$ possible values of $C_{CDACi}$. ($C_{CDACi}$ can be thought of as being equal to the combined series capacitance of capacitors 17A and 17B in FIG. 3, as subsequently explained.) Digital feedback signals from a SAR (successive approximation register) produce the "equivalent" signals represented herein as Di and Di' to control switching of the individual bit capacitors which make up $C_{CDACi}$. For simplification, the single MOSFET 26 is shown to represent the entire group of MOSFETs which selectively (in response to successive approximation feedback signals) couple one plate of each capacitor, respectively, of CDAC capacitor array 17 to reference voltage conductor 14. CDAC capacitor array 17 is shown as being also connected by MOSFET 29 to a ground conductor 33. Similarly, for simplification, the single MOSFET 29 is shown to represent the entire group of MOSFETs which selectively couple another plate of each capacitor of CDAC capacitor array 17, respectively, to the ground conductor 33.

Figure 2:
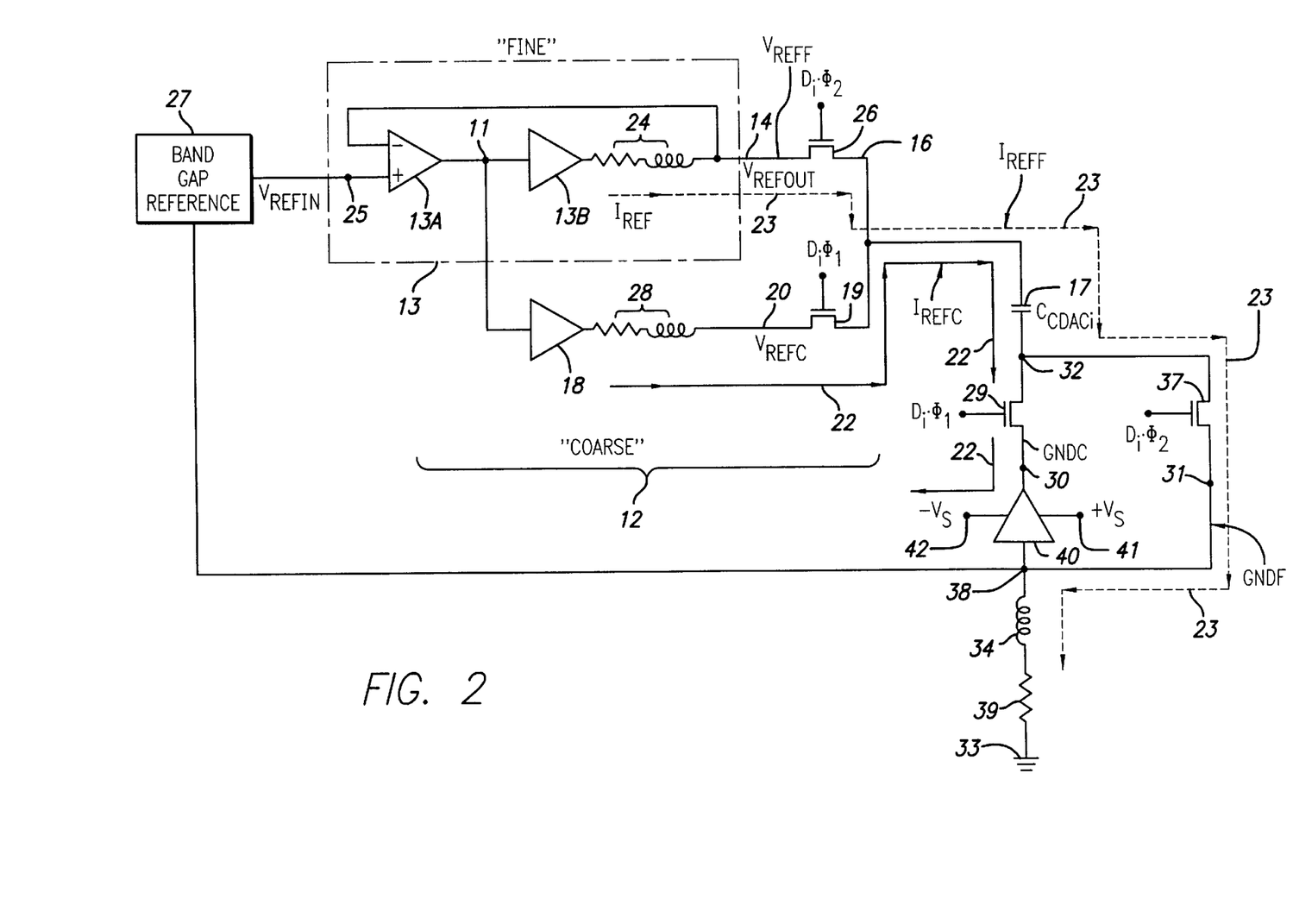
FIG. 2 is a schematic circuit diagram illustrating the reference voltage buffer circuit and ground buffer circuit of the present invention.

MOSFETs 26 and 29 are turned on by the signals $D_i$ and $D_i'$ when bit i of the CDAC capacitor array is switched to update bit i of the CDAC capacitor array. As subsequently explained with reference to FIGS. 3 and 3A, one skilled in the art will understand that switching of the capacitance of the CDAC array 17 can be modeled as charging of the above described code-dependent capacitance from a code-dependent initial voltage to the reference voltage. The signals $D_i$ and $D_i'$ represent the successive approximation feedback signals to a bit capacitor of the CDAC array that is being switched in accordance with the successive approximation feedback. Note that $D_i$ logically ANDed with $\phi_2$ to provide the gate control signal of MOSFET 26 and $D_i'$ logically ANDed with $\phi_1$ to provide the gate control signal for MOSFET 29 for simplicity are disclosed as individual logical signals; actually, $D_i$ and $D_i'$ represent combinations of different successive approximation feedback logic levels applied to control the various bit capacitor MOSFET switches. Referring also to FIG. 2, the CDAC array capacitances $C_{CDACi}$ and the MOSFETs 19, 26, 29 and 37 for similarly are shown to represent combinations of switches coupled to the various individual CDAC bit capacitors. $D_i$ and $D_i'$ are in phase, which is what is important to the explanation herein. That always results in $I_{REF}$ flowing from conductor 14 to ground conductor 33 or $-V_S$ as charge is redistributed in the CDAC capacitor array according to the successive approximation feedback from the comparator of the analog-to-digital converter.

Figure 1A:
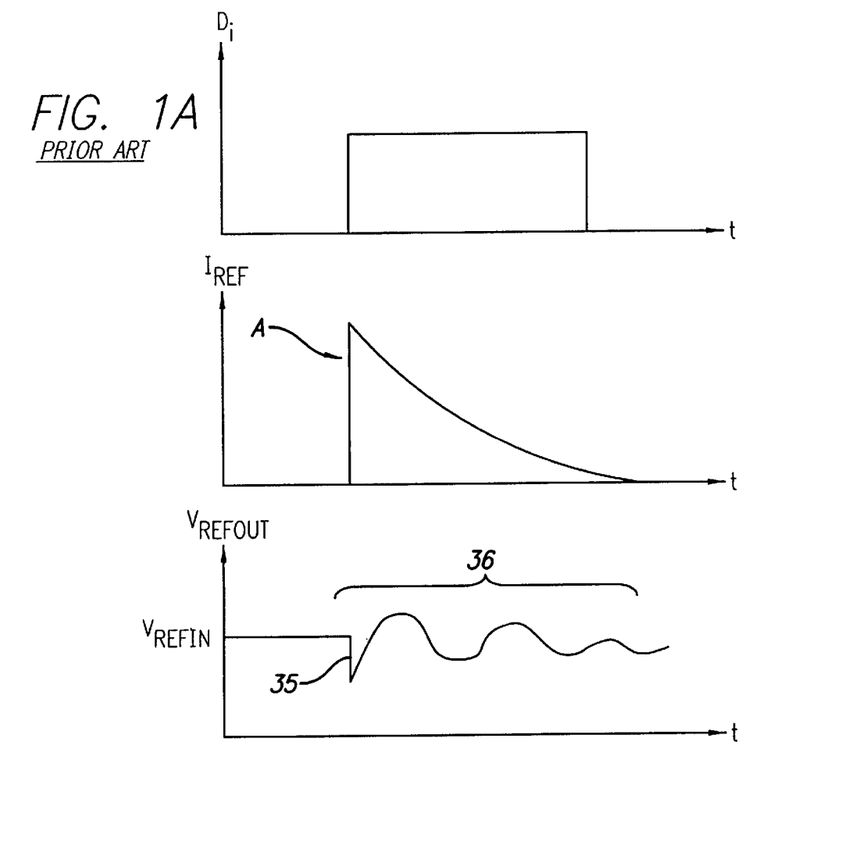
FIG. 1A is a timing diagram useful in describing the problems of the prior art circuit of FIG. 1.

The timing diagram of FIG. 1A shows the signal $D_i$, which causes a current spike A in the current $I_{REF}$ to flow through the internal impedance 24 of unity gain amplifier 13B. The resulting voltage drop across internal impedance 24 produces a negative-going spike 35 in the voltage $V_{REFOUT}$ produced on conductor 14, and also causes oscillation or instability of $V_{REFOUT}$ during the interval 36.

Obviously, to achieve precise charge redistribution in the CDAC array, and hence an accurate successive approximation test of bit i of the CDAC, the oscillation during interval 36 must be allowed to settle before the next bit can be "updated" and tested because if $V_{REFOUT}$ oscillates, the voltage on conductor 16 likewise oscillates.

In a prior art product marketed by the present assignee, the ADS7805 analog-to-digital converter, the length of an interval similar to interval 36 in FIG. 1 (which must be long enough for the oscillation to settle) is the major factor in limiting the analog-to-digital conversion rate to approximately 100 kilohertz. In general, the length of the required settling time for precision reference voltage sources in analog-to-digital converters with internal CDACs has been a major factor limiting their analog-to-digital conversion speeds. Furthermore, as such analog-to-digital converters have been designed for shorter and shorter conversion times, the charging currents produced during updating of the internal CDACs have increased. This has resulted in increased RFI (radio frequency interference), in some cases to undesirably high levels.

SUMMARY OF THE INVENTION

Accordingly, it is an object of the invention to provide a precision reference voltage circuit that avoids instability caused by a large peak current supplied to a load.

It is another object of the invention to provide a higher conversion rate in a successive approximation analog-to-digital converter utilizing an internal CDAC.

It is another object of the invention to prevent the conversion speed of a successive approximation analog-to-digital converter from being limited by instability in a reference voltage buffer.

It is another object of the invention to reduce RFI caused by large fast current spikes produced during a successive approximation process in a successive approximation analog-to-digital converter.

It is another object of the invention to provide a precision reference voltage circuit that is relatively insensitive to parasitic resistances and inductances during charging of a CDAC array capacitance to a reference voltage (or discharging it to a ground reference voltage).

Briefly described, and in accordance with one embodiment thereof, the invention provides a circuit and method for producing a stable reference voltage, by providing a circuit (27) that produces a reference voltage (VREFIN) on a first conductor (25), a buffer circuit (12) coupled to the first conductor (25) and producing a stable reference voltage on a second conductor (16), the buffer circuit 12 including an amplifier circuit (13) having an inverting input (−), a non-inverting input (+) coupled to the first conductor (25), and an output coupled to a third conductor (11), a first buffer circuit (13B) having an input coupled to the third conductor (11) and an output coupled by a fourth conductor (14) to the inverting input (−), the buffer circuit 12 also including a second buffer circuit (18) having an output (20) coupled to the second conductor (16) and an input coupled to the third conductor (11). In a described embodiment, the reference voltage is a CDAC reference voltage in a successive approximation analog-to-digital converter. A first transistor switch (19) is coupled between the output (20) of the second buffer circuit (18) and the second conductor (16). A CDAC (17) has a first reference voltage terminal connected to the second conductor (16). The CDAC also has a second reference voltage terminal (32). A second transistor switch (29) is coupled between the second reference voltage terminal (32) and a reference voltage conductor (GND or −VS). A large transient load current drawn through an internal output resistance of the second buffer circuit (18) does not produce instability in a closed loop buffer circuit (13) formed by the amplifier circuit (13A) and the first buffer circuit (13B), and the second buffer circuit (18) produces the stable reference voltage on the second conductor (16) as soon as the transient load current settles. In one described embodiment, a third transistor switch (26) is coupled between the fourth conductor (14) and the second conductor (16). The first transistor switch (19) is closed to cause an initial "coarse" charging of a first capacitance of the CDAC by the second buffer circuit (18). The third transistor switch (26) is closed after the coarse charging to perform a final precise or "fine" charging of the first capacitance of the CDAC by the first buffer circuit (13B). A control circuit is coupled to control electrodes of the first (19) and second (26) transistor switches and operates to turn the first transistor switch (19) off before turning the second transistor (26) on. A fourth transistor switch (37) is coupled between the second reference voltage terminal (32) of the CDAC and a second reference voltage conductor (GND), wherein the second transistor switch (29) is closed to provide an initial coarse discharging of a second capacitance of the CDAC and the fourth transistor switch (37) is closed after the coarse discharging of the second capacitance to perform a final precise discharging of the second capacitance to the second reference voltage of the second reference voltage conductor (GND). The second transistor switch (29) is coupled to the first reference voltage conductor (−VS) by an output circuit of a third buffer circuit (40).

DETAILED DESCRIPTION OF THE PREFERRED EMBODIMENT

Referring to FIG. 2, a conventional band gap voltage reference circuit 27 has its "ground" conductor connected to an internal (or external) ground conductor 38 of an integrated circuit that includes the entire circuit of FIG. 2. Numeral 39 represents resistance between an external ground conductor 33 and a portion of internal ground conductor 38. Numeral 34 represents an inductance of conductor 38. Band gap reference circuit 27 produces a stable reference voltage $V_{REFIN}$ on conductor 25. Conductor 25 is connected to the non-inverting input of an operational amplifier 13A. The inverting input of operational amplifier 13A is connected to conductor 14. The output of operational amplifier 13A is connected by conductor 11 to the inputs of two identical unity gain buffer circuits 13B and 18. The output of unity gain buffer circuit 13B is connected to conductor 14, and the output of buffer circuit 18 is connected to conductor 20. Numerals 24 and 28 identify output impedances of buffers 13B and 18, respectively. Each such output impedance includes a resistive component and an inductive component which can contribute to instability of the reference voltage on conductor 16. The circuitry enclosed by dashed line 13 serves as a "fine" closed loop reference voltage buffer. Buffer 18 and operational amplifier 13A together serve as a "coarse" open loop reference voltage buffer.

Conductor 14 is connected to one terminal of (MOS field effect transistor) MOSFET 26. (As indicated above with reference to FIG. 1, it should be appreciated that MOSFETs 19, 26, 29 and 37 as shown for simplification are actually "equivalent switches" useful in describing the combined effect of various combinations of "switched on" bit capacitors which combinations are different from one successive approximation bit test to another, depending on the digital code that represents the successive approximation feedback digital signal. Actually, there are $2^N$ different MOSFETs in a CDAC corresponding to each of MOSFETs 19, 26, and 29 in FIG. 2.) The other terminal of MOSFET 26 is connected by conductor 16 to one terminal of a CDAC capacitor array generally designated by numeral 17. Conductor 20 is connected to one terminal of a second MOSFET 19. A second terminal of MOSFET 19 is connected to conductor 16. The gate electrode of MOSFET 26 receives a signal $D_i \cdot \phi 2$ shown in the timing diagram of FIG. 2A. The gate electrode of MOSFET 19 receives a signal $D_i \cdot \phi 1$, also shown in FIG. 2A.

The portion of the circuitry in FIG. 2 including operational amplifier 13A, buffers 13B and 18, and MOSFETs 26 and 19 constitutes a reference voltage buffer circuit 12 which supplies a stable reference voltage to CDAC array 17 of a successive approximation analog-to-digital converter.

As previously explained with reference to FIG. 1, it should be appreciated that the capacitance of CDAC array 17 as shown in FIG. 2 also is illustrated as a "lumped" equivalent CDAC array capacitance $C_{CDACi}$, where $0 < i \leq N$ and there are $2^N$ possible combinations of value of $C_{CDACi}$. That is, if the CDAC array has N bits, then there are $2^N$ different values that $C_{CDACi}$ may assume as the corresponding bit capacitors of the CDAC array are successively connected to either ground or $V_{REFF}$ to redistribute their charge on a charge sensing conductor 48 (FIGS. 3 and 3A) which is tested by comparator 55 in a conventional successive approximation procedure. Still referring to FIG. 2, the lower terminal of the CDAC array is for simplicity shown as being connected by conductor 32 to one terminal of a single MOSFET 29, a second terminal of which is connected to conductor 30. The gate electrode of MOSFET 29 is shown as receiving the same "equivalent" signal $D_i \cdot \phi 1$ that is applied to the gate electrode of MOSFET 19.

Conductor 32 also is connected to one terminal of MOSFET 37, another terminal of which is connected to conductor 31. The gate electrode of MOSFET 37 receives the same "equivalent" signal $D_i \cdot \phi 2$ that is applied to the gate electrode of MOSFET 26. Conductor 31 is connected to internal ground conductor 38. Conductor 30 is connected to the output of a "ground buffer" circuit 40 which has an input connected to the internal ground conductor 38. Note that there is a small metal impedance 39 of between 0 and 10 ohms and a small series inductance of between 0 and 10 nanohenrys coupled in series between a portion of internal ground conductor 38 and external integrated circuit ground conductor 33. An output stage (not shown) of ground buffer circuit 40 includes a pull-down output transistor coupled to conductor 30 to cause the "coarse" current $I_{REFC}$ indicated by numeral 22 to flow into the $-V_S$ power supply conductor rather than through the internal ground conductor 38, the ground conductor impedance 39, and the external ground conductor. This substantially reduces the RFI mentioned above.

Figure 2A:
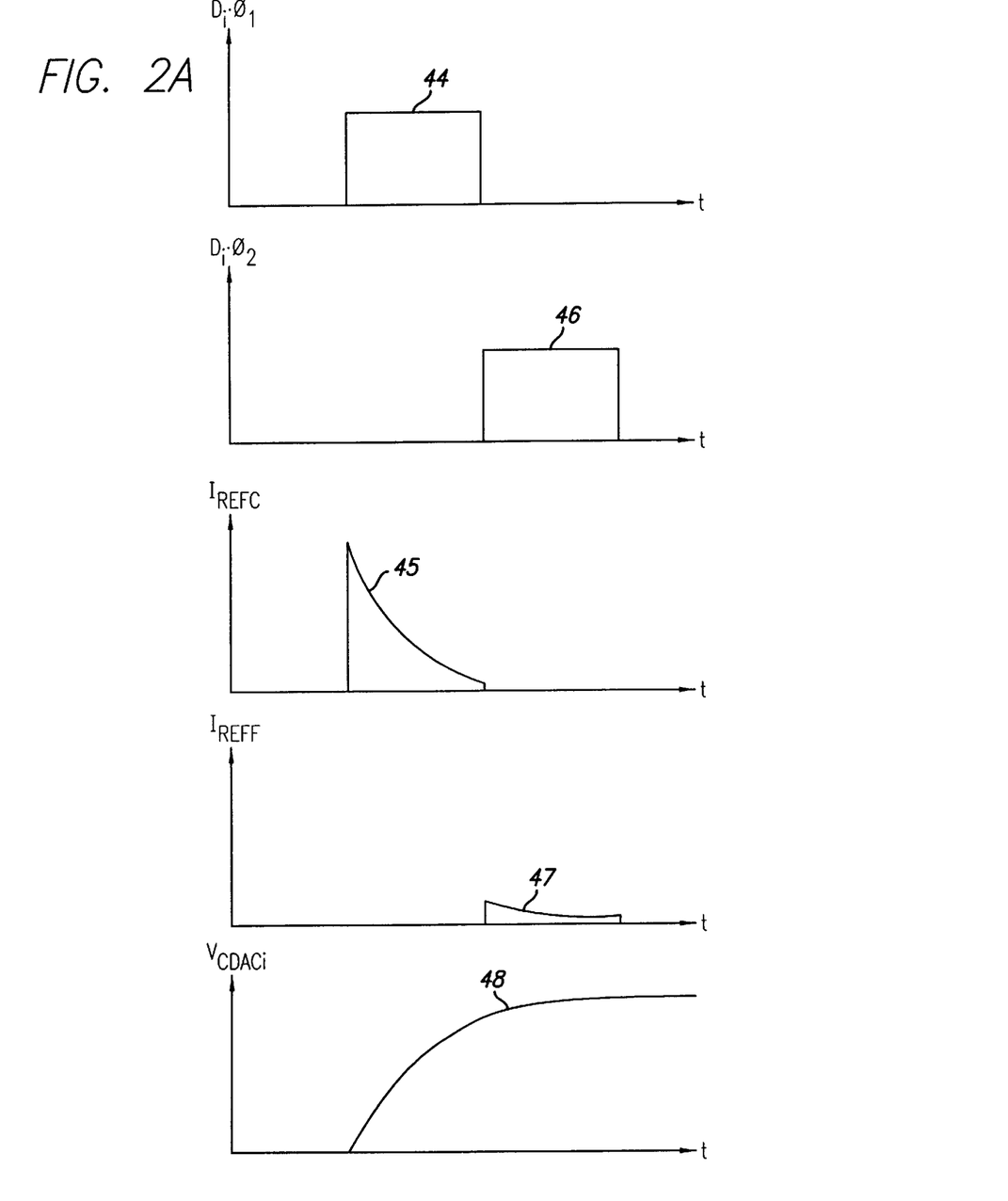
FIG. 2A is a timing diagram useful in describing the operation of the circuit of FIG. 2.
Figure 3:
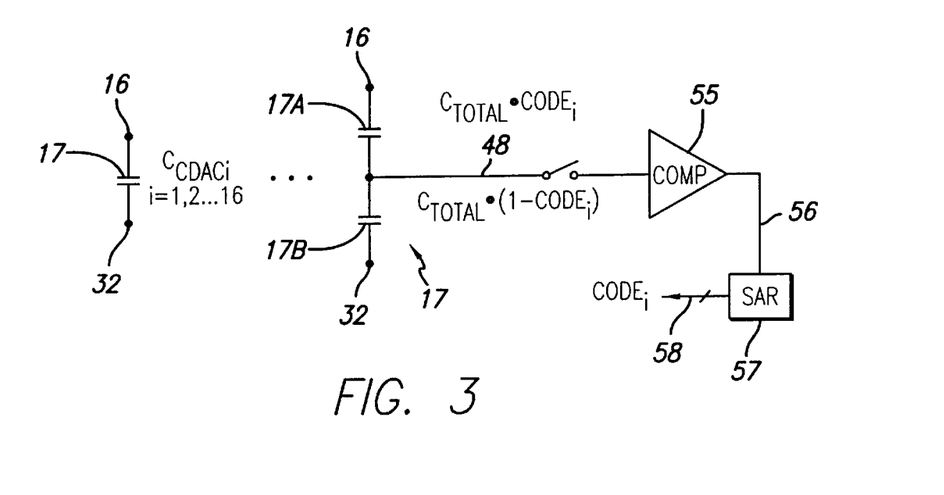
FIG. 3 is a circuit diagram useful in describing the values of the capacitance $C_{CDACi}$ of the CDAC array of FIG. 2 during a successive approximation procedure.
Figure 3A:
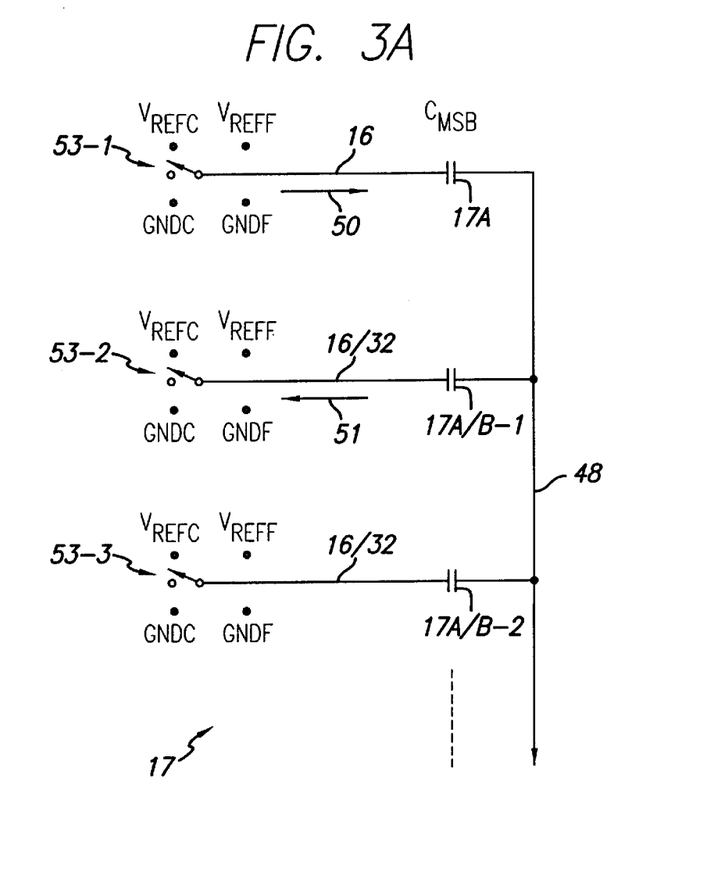
FIG. 3A is a circuit diagram useful in describing the operation of the circuit of FIG. 2.

Before describing the operation of the circuit of FIG. 2 with reference to the timing diagram of FIG. 2A, it may be helpful to first explain the reasons why the capacitance $C_{CDACi}$ can be modeled as a code-dependent capacitance as mentioned above. FIGS. 3 and 3A show that the CDAC array capacitance $C_{CDACi}$ can be "modeled" as two capacitors 17A and 17B connected in series by a summing conductor 48 which is applied to the inverting input of a comparator 55. The output 56 of comparator 55 provides feedback, one bit at a time starting with the MSB, to successively connect the binarily weighted bit capacitors of the CDAC to $V_{REFF}$ or ground. The feedback bits are loaded into a successive approximation register (SAR) 57 in the order in which they are generated by comparator 55. SAR 57 stores the accumulated feedback bits, which are applied to control the various bit switches that connect the corresponding bit capacitors to $V_{REFF}$ or ground.

This causes the value of the CDAC array capacitance $C_{CDACi}$ to successively take on N of the $2^N$ possible different values during the N-bit successive approximation procedure, as updated bit capacitor charges are "redistributed" via charge summing conductor 48 with the charges on the more significant bit capacitors which have previously been updated in the successive approximation process. Such updating requires the flow of the currents $I_{REFC}$ and $I_{REFF}$ from the reference voltage buffer circuit 12 of the present invention. That is, the currents resulting from bit capacitor switching controlled by the successive approximation feedback flow out of the reference voltage source which establishes the "1" level into CDAC array 17 and also out of CDAC array 17 into conductors ($-V_S$ or ground) which establish the "0" level. The capacitor 17A shown in FIG. 3 has a capacitance during updating of bit i of the CDAC equal to $C_{TOTAL} \cdot CODEi$, where $C_{TOTAL}$ is the total maximum capacitance of all of the CDAC bit capacitors. Capacitor 17B has a capacitance equal to $C_{TOTAL} \cdot (1-CODEi)$. CODEi is a coefficient which represents the normalized output code of SAR 57, so the digital value of CODEi is between 0 and 1, where $0 < i \leq N$. Just as for $C_{CDACi}$, there are N out of $2^N$ possible values of CODEi during each N-bit successive approximation process.

FIG. 3A illustrates a portion of the CDAC array 17, including capacitor 17A which can be used both for sampling the analog input voltage of an analog-to-digital converter and as the MSB capacitor of the CDAC array 17. The CDAC array 17 also includes a number of additional capacitors 17A/B-1, 17A/B-2 . . . etc. Each of these capacitors has one plate connected to charge summing conductor 48B and another terminal connected to one pole of switching circuitry modeled in FIG. 3A as single pole, quadruple throw switches 53-1, 53-2, 53-3, etc., respectively.

Referring again to FIGS. 2 and 2A, and in accordance with the present invention, closed loop "fine" reference voltage buffer 13 maintains the value of $V_{REFF}$ on conductor 14 that is precisely equal to the value $V_{REFIN}$ produced on conductor 25 by internal or external band gap reference circuit 27, irrespective of any input offset voltages associated with operational amplifier 13A or unity gain buffer amplifier 13B, and also irrespective of any internal voltage drops across output impedance 24 of unity gain buffer amplifier 13B.

If both MOSFETs 19 and 26 are off, exactly the same voltage is produced on both conductors 14 and 20 because unity gain buffer amplifier 18 is identical to unity gain buffer amplifier 13B. Initially MOSFET switches 19 and 29 are turned on by pulse 44 of the $D_i \cdot \phi 1$ signal. This causes an initially large "coarse" current $I_{REFC}$ pulse 45 to flow through unity gain buffer amplifier 18 and its internal impedance 28 and through the path indicated by arrows 22. $I_{REFC}$ pulse 45 may be as high as about 10 milliamperes in amplitude, with a decay time as little as about 2 nanoseconds, at the present state of the art. This transient current pulse flows into CDAC array 17 and through MOSFET 29, through a pull-down transistor (not shown) in the output stage of ground buffer 40, and into the $-V_S$ power supply voltage conductor 42.

Consequently, the large initial spike in $I_{REFC}$ indicated by numeral 45 in FIG. 2A does not flow through the internal ground conductor impedance 39 and inductance 34 into the external ground conductor 33. This has the advantage of reduced RFI, and also has the advantage of preventing ground error voltages across internal ground conductor impedance 39 due to the $I_{REFC}$ pulse 45 in FIG. 2A. That improves the accuracy of band gap reference circuit 27 or any other circuit in the integrated circuit chip which uses internal ground conductor 38 as a ground reference voltage.

The duration of pulse 44 in FIG. 2A is not long enough to allow the capacitance being charged in CDAC array 17 to be completely charged to the desired reference voltage $V_{REFF}$. However, most of the energy and charge required by CDAC array 17 during the "updating" of the present step of the successive approximation operation has been supplied by "coarse" buffer 18 by the time pulse 44 turns MOSFETs 19 and 29 off.

Next, pulse 46 of $D_i \cdot \phi 2$ and any simultaneous corresponding pulse of $\bar{D}_i \cdot \phi 2$ turns MOSFETs 26 and 37 on, after MOSFETs 19 and 29 have been turned off. The "fine" current $I_{REFF}$ indicated by numeral 47 in FIG. 2A is much smaller than the current indicated by pulse 45, and flows through the output resistance 24 of unity gain buffer amplifier 13B, through MOSFET 26, into CDAC array 17, through MOSFET 37, into internal ground conductor 38, ground conductor impedance 39 and its associated inductance 34 and into external ground conductor 33. Since the magnitude of the current $I_{REFF}$ during pulse 47 is very small, it develops a negligible amount of ground voltage error across impedance 39 of internal ground conductor 38. Also, the small magnitude of $I_{REFF}$ produces a negligible voltage drop across output resistance 24 of unity gain buffer amplifier 13B.

Therefore, there is very little feedback of any noise signal to conductor 11 in response to $I_{REFF}$ pulse 47 which would cause the closed loop "fine" reference voltage buffer 13 to oscillate. Consequently, very little settling time is required. As indicated by the $V_{CDACi}$ curve 48 in FIG. 2A, by the end of pulse 46 $I_{REFF}$ has fallen essentially to zero, and there is no instability in the voltage across CDAC array 17. Therefore, the next phase of the present successive approximation operation can safely begin, wherein the voltage on the charge summing conductor 48 is tested by comparator 55 to determine whether the feedback for the present bit (bit i) should be a "1" or a "0".

It should be appreciated that if a sufficiently low output resistance and inductance can be provided in the reference voltage buffer, then there might be no oscillation. Then the "coarse/fine" reference voltage buffer arrangement shown in FIG. 2 might be unnecessary. However, it nevertheless may still be desirable to use the "coarse/fine" ground buffer approach including MOSFETs 29 and 37 and ground buffer 40 as shown.

Figure 4:
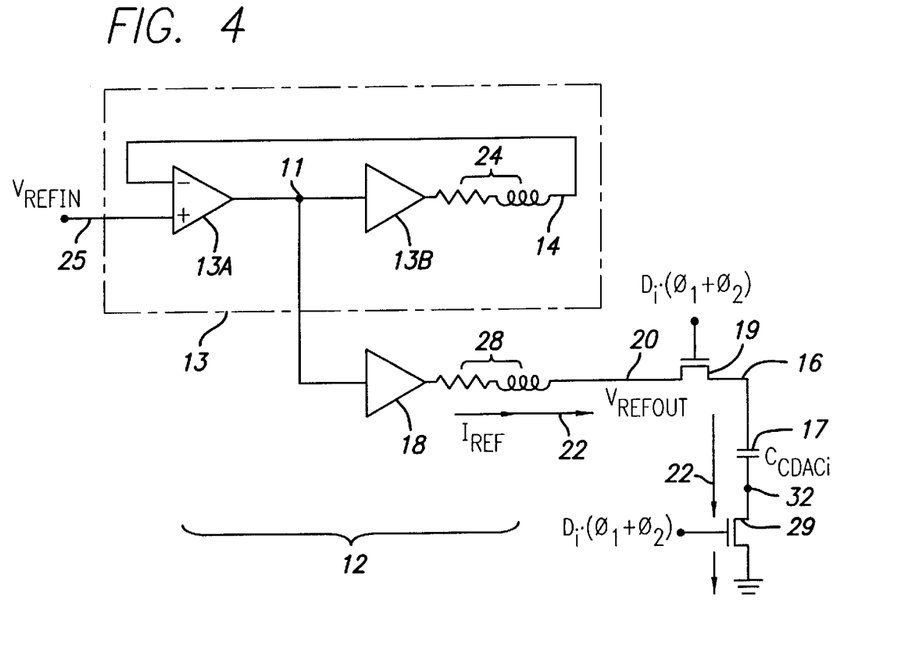
FIG. 4 is a block diagram of an alternate embodiment of the invention.
Figure 4A:
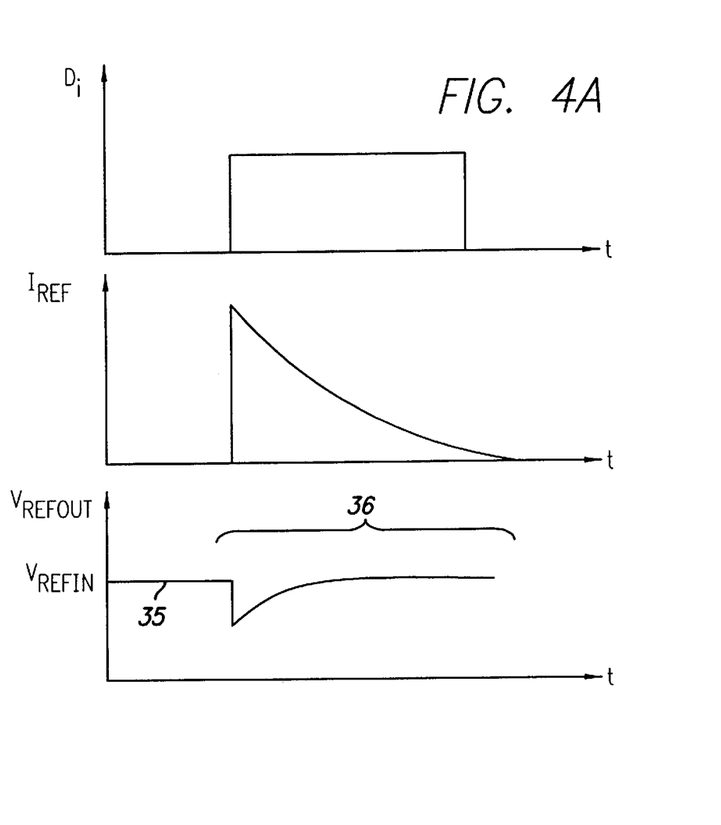
FIG. 4A is a timing diagram useful in explaining the operation of the embodiment of FIG. 4.

FIG. 4 shows an alternate embodiment of the invention, in which the conductor 14 of closed loop buffer circuit 13 (including operational amplifier 13A and unity gain buffer 13B) is not connected to CDAC array 17. The reference voltage terminal of CDAC array 17 is coupled only to an output reference voltage $V_{REFOUT}$ on conductor 20 which, as in FIG. 2, is connected to the output of open loop unity gain amplifier 18. As in FIG. 2, the internal resistances of unit gain buffer amplifiers 13B and 18 are indicated by resistances 24 and 28, respectively. In the timing diagram of FIG. 4A, the $D_i$ pulse and the $I_{REF}$ pulse are the same as in FIG. 1A for the prior art circuit shown in FIG. 1. However, since essentially no current flows through output resistance 24 of unity gain buffer amplifier 13B in the embodiment of FIG. 4, the reference voltage buffer circuit 13 has essentially no tendency to oscillate. Consequently, the large charging current pulse which flows through the output resistance 28 of unity gain buffer amplifier 28 through MOSFET 19 and CDAC array 17 has essentially no effect on reference voltage buffer circuit, and the value of $V_{REFOUT}$ stabilizes rapidly during the interval 36, as shown in FIG. 4A. The circuit of FIG. 4 may be very useful in providing a high speed successive approximation analog-to-digital converter, although its accuracy might be slightly less than is obtained for the configuration shown in FIG. 2.

The above described embodiments of the invention steer relatively high "coarse" currents into circuit nodes which are relatively insensitive to such high currents and consequently result in less cross coupling and hence less RFI and errors produced thereby than the prior art.

The above described invention enables the assignee's recently introduced product, a 16 bit integrated circuit successive approximation analog-to-digital converter, to operate easily at a 250 kilohertz conversion rate. Furthermore, the settling time of the reference voltage was not the limiting factor in the conversion rate, as was the case in the prior art devices. Another advantage of the above described invention is that very little error voltage is produced in the internal ground conductor or in external ground conductor because the large $I_{REFC}$ pulses flow through the ground buffer and out of the $-V_S$ conductor. The elimination of the oscillations during the interval 36 (FIG. 1A) of the prior art decreases the conversion time and increases the conversion rate by avoiding the need to wait for the reference voltage oscillations to settle to a negligible value that does not produce errors in the successive approximation process.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, the "fine" reference voltage buffer 13 in FIG. 2 could be an open loop buffer instead of a closed loop buffer (in which case the input offset voltage of amplifier 13A and unity gain buffer 13B would undesirably contribute to the difference between $V_{REFIN}$ and $V_{REFF}$).

Furthermore, although an internal reference voltage circuit has been described above, an external reference voltage circuit can be utilized. Although the described embodiments of the invention switch the terminals of the CDAC capacitors between a reference voltage and a "ground" voltage, in general two reference buffers can be provided to supply first and second reference voltages between the terminals of the CDAC array capacitors as they are switched to provide "coarse" and "fine" charging currents.

What is claimed is:

1. Circuitry for producing a stable CDAC reference voltage in a successive approximation analog-to-digital converter, comprising in combination:

(a) an amplifier circuit having a non-inverting input receiving a reference voltage;

(b) a first buffer circuit having an input coupled to an output of the amplifier circuit and an output coupled to an inverting input of the amplifier circuit;

(c) a second buffer circuit having an output coupled to a first conductor of a CDAC and also having an input coupled to the output of the amplifier circuit;

(d) a first switch coupling the output of the first buffer circuit to the first conductor; and (e) a second switch coupling the output of the second buffer circuit to the first conductor.

2. The circuitry of claim 1 wherein a large transient load current drawn by the CDAC through an output impedance of the second buffer circuit is supplied by the second buffer circuit while the second switch is closed and the first switch is open and therefore avoiding instability in a closed loop buffer circuit formed by the amplifier circuit and the first buffer circuit, the first buffer circuit producing the stable reference voltage on the first conductor while the first switch is closed and the second switch is open.

3. Circuitry for producing a stable CDAC reference voltage in a successive approximation analog-to-digital converter including a CDAC array having a first conductor and a second conductor, comprising in combination:

(a) an amplifier circuit having a non-inverting input receiving a reference voltage;

(b) a first buffer circuit having an input coupled to an output of the amplifier circuit and an output coupled to an inverting input of the amplifier circuit;

(c) a second buffer circuit having an input coupled to the output of the amplifier circuit;

(d) a first switch coupling an output of the second buffer circuit to the first conductor of the CDAC array; and (e) a second switch coupled between the second conductor of the CDAC array and a reference voltage conductor.

4. The circuitry of claim 3 wherein a large transient load current drawn by the CDAC through an output impedance of the second buffer circuit is supplied by the second buffer circuit to avoid instability in a closed loop buffer circuit formed by the amplifier circuit and the first buffer circuit so the second buffer circuit produces the stable reference voltage on the second conductor as soon as the transient load current settles.

5. Circuitry for producing a stable reference voltage, comprising in combination:

(a) a voltage reference circuit producing a reference voltage on a first conductor;

(b) buffer circuitry coupled to the first conductor and producing a stable reference voltage on a second conductor, the buffer circuitry including
1. an amplifier circuit having an inverting input, a non-inverting input coupled to the first conductor, and an output coupled to a third conductor,
2. a first buffer circuit having an input coupled to the third conductor and an output coupled by a fourth conductor to the inverting input, and
3. a second buffer circuit having an output coupled to the second conductor and also having an input coupled to the third conductor;

(c) a first transistor switch coupling the output of the first buffer circuit to the second conductor;

(d) a second transistor switch coupling the output of the second buffer circuit to the second conductor;
a large transient load current drawn from the second conductor through an output impedance of the second buffer circuit being supplied by the second buffer circuit while the second transistor switch is closed and the first transistor switch is open and therefore avoiding instability in a closed loop buffer circuit formed by the amplifier circuit and the first buffer circuit, the first buffer circuit producing the stable reference voltage on the second conductor while the first transistor switch is closed and the second transistor switch is open.

6. A method for producing a stable CDAC reference voltage, comprising the steps of:

(a) producing a reference voltage on a first conductor;

(b) producing a stable reference voltage on a second conductor by means of buffer circuitry coupled to the first conductor, the buffer circuitry including
1. an amplifier circuit having an inverting input, a non-inverting input coupled to the first conductor, and an output coupled to a third conductor,
2. a first buffer circuit having an input coupled to the third conductor and an output coupled by a fourth conductor to the inverting input, and
3. a second buffer circuit having an output coupled to the second conductor and an input coupled to the third conductor;

(c) coupling the output of the first buffer circuit to the second conductor and coupling the output of the second buffer circuit to the second conductor while a large transient load current is being drawn by a load through an output impedance of the second buffer circuit being supplied by the second buffer circuit to avoid instability in a closed loop buffer circuit formed by the amplifier circuit;

(d) decoupling the second buffer circuit from the second conductor and coupling the first buffer circuit to the second conductor to produce the stable reference voltage on the second conductor.

7. The method of claim 6 including decoupling the second buffer circuit from the second conductor before coupling the first buffer circuit to the second conductor.

8. A method for producing a stable reference voltage, comprising the steps of:

(a) producing a reference voltage on a first conductor;

(b) coupling a non-inverting input of an amplifier circuit to the first conductor;

(c) coupling an input of a first buffer circuit to an output of the amplifier circuit and coupling an output of the first buffer circuit to the inverting input of the amplifier circuit;

(d) coupling an input of a second buffer circuit to the output of the amplifier circuit and coupling an output of the second buffer circuit to a second conductor,
whereby a large transient load current drawn through an internal output impedance of the second buffer circuit avoids instability in a closed loop buffer circuit formed by the amplifier circuit and the first buffer circuit so the buffer circuitry can produce the stable reference voltage on the second conductor as soon as the transient load current settles.

9. Circuitry for producing a stable CDAC reference voltage in a successive approximation analog-to-digital converter, comprising in combination:

(a) a voltage reference circuit producing a reference voltage on a first conductor;

(b) buffer circuitry coupled to the first conductor and producing a stable reference voltage on a second conductor, the buffer circuitry including
1. an amplifier circuit having an inverting input, a non-inverting input coupled to the first conductor, and an output coupled to a third conductor,
2. a first buffer circuit having an input coupled to the third conductor and an output coupled by a fourth conductor to the inverting input, and
3. a second buffer circuit having an output coupled to the second conductor and also having an input coupled to the third conductor;

(c) a first transistor switch coupling the output of the first buffer circuit to the second conductor;

(d) a second transistor switch coupling the output of the second buffer circuit to the second conductor;

(e) a CDAC having a first terminal connected to the second conductor, the CDAC having a second terminal; and (f) a third transistor switch coupled between the second terminal of the CDAC and a ground reference voltage conductor, a large transient load current drawn by the CDAC through an output impedance of the second buffer circuit being supplied by the second buffer circuit while the second transistor switch is closed and the first transistor switch is open and therefore avoiding instability in a closed loop buffer circuit formed by the amplifier circuit and the first buffer circuit, the first buffer circuit producing the stable reference voltage on the second conductor while the first transistor switch is closed and the second transistor switch is open.

10. The circuit of claim 9 including conductors supplying control signals coupled to control electrodes of the first and second transistor switches and operative to turn the second transistor switch off before turning the first transistor switch on.

11. The circuit of claim 9 including a fourth transistor switch coupling the second terminal of the CDAC to a supply voltage conductor, wherein the fourth transistor switch is closed to provide an initial coarse discharging of the CDAC and the third transistor switch is closed after the coarse discharging of the CDAC to perform a final precise discharging of the CDAC to a ground reference voltage on the ground reference voltage conductor.

12. The circuit of claim 11 wherein the third transistor switch is open during the final precise discharging.

13. The circuit of claim 12 wherein the fourth transistor switch is coupled to the supply voltage conductor by an output of a third buffer circuit.

14. A successive approximation analog-to-digital converter, comprising in combination:

(a) a CDAC operative to sample an analog input voltage;

(b) a comparator operative to test a voltage on a charge summing conductor of the CDAC;

(c) a SAR operative to receive and store digital feedback produced by the comparator, the CDAC including a plurality of bit capacitors each coupled to the charge summing conductor and each switchable to a first reference voltage and a ground reference voltage;

(d) a circuit producing a reference voltage on a first conductor;

(e) buffer circuitry coupled to the first conductor and producing a stable reference voltage on the first reference voltage conductor, the buffer circuitry including 1. an amplifier circuit having an inverting input, a non-inverting input coupled to the first conductor, and an output coupled to a second conductor, 2. a first buffer circuit having an input coupled to the second conductor and an output coupled to the inverting input and a first reference voltage conductor, and 3. a second buffer circuit having an output coupled to the first reference voltage conductor and also having an input coupled to the second conductor;

(f) a first transistor switch coupling the output of the second buffer circuit to the first reference voltage conductor;

(g) the CDAC having a first terminal connected to the first reference voltage conductor, the CDAC having a second terminal;

(h) a second transistor switch coupling the output of the second buffer circuit to the first reference voltage conductor;

(i) a third transistor switch coupling the second terminal of the CDAC to the ground voltage conductor, to avoid instability in a closed loop buffer circuit formed by the amplifier circuit and the first buffer circuit when a large transient load current is drawn by the CDAC through an output impedance of the second buffer circuit and the first buffer circuit produces the stable reference voltage on the second conductor after the transient load current settles.

15. The successive approximation analog-to-digital converter of claim 14 wherein the SAR produces digital code signals operative to close the first transistor switch to cause an initial coarse charging of the CDAC by the second buffer circuit and then open the first transistor switch and close the second transistor switch to perform a final precise charging of the CDAC by the first buffer circuit.

16. The successive approximation analog-to-digital converter of claim 15 including a fourth transistor switch coupling the second reference terminal of the CDAC to a supply voltage conductor, wherein the fourth transistor switch is closed to provide an initial coarse discharging of the CDAC and the third transistor switch is closed after the coarse discharging of the second capacitance to perform a final precise discharging of the second capacitance to the second reference voltage of the second reference voltage conductor.

17. The successive approximation analog-to-digital converter of claim 16 wherein the fourth transistor switch is coupled to the supply voltage conductor by an output of a third buffer circuit.

18. A circuit for producing a stable ground reference voltage in a successive approximation analog-to-digital converter which includes i. a CDAC operative to sample an analog input voltage, ii. a comparator operative to test a voltage on a charge summing conductor of the CDAC, iii. a SAR operative to receive and store digital feedback produced by the comparator, the CDAC including a plurality of bit capacitors each coupled to the charge summing conductor and each switchable between a first reference voltage and a ground reference voltage, iv. a first transistor switch coupled between the CDAC circuit and a first reference voltage conductor, v. the CDAC having a first reference voltage terminal coupled to the first reference voltage conductor, the CDAC having a ground reference voltage terminal, and vi. a second transistor switch having a first terminal coupled to the CDAC and a second terminal coupled to the ground reference voltage conductor, the circuit for producing the stable ground reference voltage comprising in combination:

(a) a third transistor switch having a first terminal coupled to the CDAC and a second terminal;

(b) a buffer circuit having an output operatively coupling the second terminal of the third transistor switch to a supply voltage conductor; and (c) wherein the third transistor switch is closed to provide an initial coarse discharging of a capacitance of the CDAC and the second transistor switch is closed after the coarse discharging of the capacitance to perform a final precise discharging of the capacitance to the ground reference voltage of the ground reference voltage conductor.

19. Circuitry for producing a stable reference voltage, comprising in combination:
(a) a voltage reference circuit producing a reference voltage on a first conductor; and
(b) circuitry coupled to the first conductor and producing a stable reference voltage on a second conductor, the circuitry including
1. an amplifier circuit having an inverting input, a non-inverting input coupled to the first conductor, and an output coupled to a third conductor,
2. a first buffer circuit having an input coupled to the third conductor and an output coupled by a fourth conductor to the inverting input, and
3. a second buffer circuit having an output coupled to the second conductor and an input coupled to the third conductor,
whereby a large transient load current drawn through an internal output impedance of the second buffer circuit avoids instability in a closed loop buffer circuit formed by the amplifier circuit and the first buffer circuit so the buffer circuitry can produce the stable reference voltage on the second conductor as soon as the transient load current settles.

20. Circuitry for producing a stable CDAC reference voltage in a successive approximation analog-to-digital converter, comprising in combination:
(a) a voltage reference circuit producing a reference voltage on a first conductor;
(b) buffer circuitry coupled to the first conductor and producing a stable reference voltage on a second conductor, the buffer circuitry including
1. an amplifier circuit having an inverting input, a non-inverting input coupled to the first conductor, and an output coupled to a third conductor,
2. a first buffer circuit having an input coupled to the third conductor and an output coupled by a fourth conductor to the inverting input, and
3. a second buffer circuit having an output coupled to the second conductor and also having an input coupled to the third conductor;
(c) a first transistor switch coupling the output of the second buffer circuit to the second conductor;
(d) a CDAC having a first terminal coupled to the second conductor, the CDAC having a second terminal; and
(e) a second transistor switch coupled between the second terminal and a reference voltage conductor,
whereby a large transient load current drawn by the CDAC through an output impedance of the second buffer circuit is supplied by the second buffer circuit to avoid instability in a closed loop buffer circuit formed by the amplifier circuit and the first buffer circuit so the second buffer circuit produces the stable reference voltage on the second conductor as soon as the transient load current settles.

21. A circuit for producing a stable ground reference voltage comprising in combination:
(a) a first transistor switch having a first terminal coupled to a load circuit and a second terminal coupled to a ground reference voltage conductor,
(b) a second transistor switch having a first terminal coupled to the load circuit and a second terminal;
(c) a buffer circuit having an output operatively coupling the second terminal of the second transistor switch to a supply voltage conductor; and
(d) wherein the second transistor switch is closed to provide an initial coarse discharging of a capacitance of the CDAC into the supply voltage conductor and the first transistor switch is closed after the coarse discharging of the capacitance to perform a final precise discharging of the capacitance to the ground reference voltage of the ground reference voltage conductor.

* * * * *